(12) United States Patent
Chen

(10) Patent No.: US 8,427,210 B2
(45) Date of Patent: Apr. 23, 2013

(54) CHARGE PUMP

(75) Inventor: Chien-Liang Chen, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 160 days.

(21) Appl. No.: 13/190,555

(22) Filed: Jul. 26, 2011

(65) Prior Publication Data

US 2013/0027086 A1   Jan. 31, 2013

(51) Int. Cl.
*H03L 7/06* (2006.01)
(52) U.S. Cl.
USPC ............................................................ 327/157
(58) Field of Classification Search .................. 327/146, 327/157
See application file for complete search history.

(56) References Cited

U.S. PATENT DOCUMENTS

| | | | | |
|---|---|---|---|---|
| 5,508,660 | A * | 4/1996 | Gersbach et al. | 331/17 |
| 6,329,872 | B1 * | 12/2001 | Foroudi | 327/541 |
| 7,498,888 | B2 * | 3/2009 | Nitsche et al. | 331/17 |
| 7,579,903 | B2 * | 8/2009 | Oku | 327/538 |
| 8,217,690 | B2 * | 7/2012 | Hu et al. | 327/156 |
| 8,368,442 | B1 * | 2/2013 | Chen | 327/157 |
| 8,378,725 | B2 * | 2/2013 | Thakur et al. | 327/157 |
| 2011/0102034 | A1 * | 5/2011 | Haerle | 327/157 |
| 2012/0098581 | A1 * | 4/2012 | Haerle | 327/157 |
| 2013/0027086 | A1 * | 1/2013 | Chen | 327/3 |

OTHER PUBLICATIONS

Stefanos Sidiropoulos, Dean Liu, Jaeha Kim, Guyeon Wei and Mark Horowitz, "Adaptive Bandwidth DLLs and PLLs using Regulated Supply CMOS Buffers", 2000, Symposium on VLSI Circuits Digest of Technical Papers.

* cited by examiner

*Primary Examiner* — Adam Houston
(74) *Attorney, Agent, or Firm* — WPAT PC; Justin King

(57) ABSTRACT

A charge pump includes a first current source unit and a second current source unit. The first current source unit is connected between a first voltage terminal and the control node. The second current source unit is connected between the control node and a second voltage terminal. According to a phase comparing signal, the first current source unit provides a first switching current to the control node. The second current source unit includes a first sub-switching current generator, a second sub-switching current generator and a select circuit. According to a voltage level of the phase comparing signal, the first sub-switching current generator generates a first sub-switching current. According to the voltage level of the phase comparing signal, the second sub-switching current generator generates a second sub-switching current. By the select circuit, the first sub-switching current or the second sub-switching current is provided to the control node.

10 Claims, 11 Drawing Sheets

|  | Logic state of Vcmp | Logic state of Vcmp' | First controlling block | | Voltage level at S1 | Voltage level at S2 |
| --- | --- | --- | --- | --- | --- | --- |
|  |  |  | 1st semiconductor switch | 2nd semiconductor switch |  |  |
| Vcont < Vdc | 0 | 1 | ON | OFF | Vdown | 0 |
| Vcont > Vdc | 1 | 0 | OFF | ON | 0 | Vdown |

|  | Second controlling block | |
| --- | --- | --- |
|  | 3rd semiconductor switch | 4th semiconductor switch |
| Vcont < Vdc | OFF | ON |
| Vcont > Vdc | ON | OFF |

FIG. 5B

CHARGE PUMP

FIELD OF THE INVENTION

The present invention relates to a charge pump, and more particularly to a charge pump for dynamically output a current according to a voltage level change at a control node.

BACKGROUND OF THE INVENTION

FIG. 1 is a schematic functional block diagram illustrating a conventional phase locked loop (PLL). As shown in FIG. 1, the phase locked loop 10 includes a phase detector 101, a charge pump (CP) 103, a low pass filter (LF) 105 and a voltage control oscillator (VCO) 107. Moreover, the phase locked loop 10 is optionally equipped with a frequency divider 109. The operating principle of the phase locked loop 10 will be illustrated as follows. Firstly, a divided signal $V_{div}$ from the frequency divider 109 and an input signal $V_{in}$ are acquired. Then, a phase difference between the divided signal $V_{div}$ and the input signal $V_{in}$ is detected. According to the phase difference, the frequency $f_{out}$ of an output signal $V_{out}$ from the voltage control oscillator 107 is adjusted. The frequency of the output signal $V_{out}$ is divided by the frequency divider 109, and the divided signal $V_{div}$ is issued to the phase detector 101. Ideally, the divided signal $V_{div}$ is identical to the input signal $V_{in}$.

Please refer to FIG. 1 again. The output signal $V_{out}$ from the voltage control oscillator 107 has a phase $\theta_{out}$ and a frequency $f_{out}$. By the frequency divider 109, the frequency of the output signal $V_{out}$ is divided, so that the divided signal $V_{div}$ has a phase $\theta_{div}$ and a frequency $f_{div}$. Moreover, the input signal $V_{in}$ from the external source to the phase locked loop 10 has a phase $\theta_{in}$.

The phase detector 101 will compare the phase $\theta_{div}$ of the divided signal $V_{div}$ with the phase $\theta_{in}$ of the input signal $V_{in}$, thereby acquiring a phase difference ($\theta_{in} - \theta_{div}$). According to the phase difference, a set of phase comparing signal ($V_{up}$, $V_{down}$) is issued from the phase detector 101 to the charge pump 103. The set of phase comparing signal ($V_{up}$, $V_{down}$) is utilized by the charge pump 103 and the low pass filter 105 for outputting a control voltage. According to the control voltage, the output signal $V_{on}$ from the voltage control oscillator 107 is adjusted.

FIG. 2A is a schematic circuit diagram illustrating a charge pump used in the conventional phase locked loop. As shown in FIG. 2A, the charge pump 103 includes a first current source unit 103a and a second current source unit 103b. The first current source unit 103a includes a first current source 1031 and a first switch 1033. The second current source unit 103b includes a second current source 1032 and a second switch 1034.

The first current source 1031 and the second current source 1032 of the charge pump 103 are employed to provide a first switching current $I_P$ and a second switching current $I_N$, respectively. Depending on the on/off statuses of the switches 1033 and 1034, the low pass filter 105 is selectively charged or discharged by the first switching current $I_P$ and a second switching current $I_N$ through a control node $S_{cont}$. Moreover, the first switch 1033 and the second switch 1034 are respectively turned on according to a first phase comparing signal $V_{up}$ and a second phase comparing signal $V_{down}$ issued from the phase detector 101.

FIG. 2B is a waveform diagram illustrating the phase comparing signal outputted from the phase detector and the output current at the control node. The horizontal axis denotes time (t). The vertical axis denotes the voltage change of the phase comparing signals ($V_{up}$, $V_{down}$) and the switching current outputted from the charge pump 103.

In a case that the first switch 1033 is turned on according to the first phase comparing signal $V_{up}$ outputted from the phase detector 101, the charge pump 103 issues the first switching current $I_P$. Under this circumstance, the low pass filter 105 is charged by the first switching current $I_P$. That is, the duration of the high-level state of the first phase comparing signal $V_{up}$ denotes the time period of outputting the first switching current $I_P$. Moreover, the duration of the high-level state of the first phase comparing signal $V_{up}$ also denotes the time period of charging the low pass filter 105 by the charge pump 103.

Whereas, in a case that the second switch 104 is turned on according to the second phase comparing signal $V_{down}$ outputted from the phase detector 101, the charge pump 103 issues the second switching current $I_N$. According to the second switching current $I_N$, the low pass filter 105 is discharged. That is, the duration of the high-level state of the second phase comparing signal $V_{down}$ denotes the time period of outputting the second switching current $I_N$. Moreover, the duration of the high-level state of the second phase comparing signal $V_{down}$ also denotes the time period of discharging the low pass filter 105 by the charge pump 103.

From the above discussions, the low pass filter 105 is selectively charged or discharged by a combination of the first switching current $I_P$ and the second switching current $I_N$, i.e. $I_{CP}$. In the charge pump 103, the first current source unit 103a and the second current source unit 103b are implemented by p-channel metal-oxide-semiconductor (PMOS) transistors and n-channel metal-oxide-semiconductor (NMOS) transistors, respectively.

Ideally, the influences of the charging/discharging operations of the first current source unit 103a and the second current source unit 103b on the low pass filter 105 can be balanced. Since these two types of transistors are not completely symmetrical to each other, the magnitudes of the charging current and the discharging current are not completely equal to each other. That is, the magnitudes of the first switching current $I_P$ and the second switching current $I_N$ outputted from the control node $S_{cont}$ of the charge pump 103 are not identical.

Since the PMOS transistor and the NMOS transistor have different inherent characteristics, the first switching current $I_P$ generated by the PMOS transistor in the first current source unit 103a and the second switching current $I_N$ generated by the NMOS transistor in the second current source unit 103b are not always equal. Under this circumstance, the performance of the phase locked loop 10 is deteriorated. Therefore, there is a need of providing an improved charge pump to obviate the drawbacks encountered from the prior art.

SUMMARY OF THE INVENTION

In accordance with an aspect, the present invention provides a charge pump for providing a current to a control node according to a phase comparing signal. The charge pump includes a first current source unit and a second current source unit. The first current source unit is connected between a first voltage terminal and the control node for providing a first switching current to the control node according to the phase comparing signal. The second current source unit is connected between the control node and a second voltage terminal. The second current source unit includes a first sub-switching current generator, a second sub-switching current generator and a select circuit. The first sub-switching current generator is electrically connected to the control node and the second voltage terminal. According to a voltage level of the phase comparing signal, the first sub-switching current generator generates a first sub-switching current. The second sub-switching current generator is electrically connected to the control node and the second voltage terminal. According to the voltage level of the phase comparing signal, the second sub-switching current generator generates a second sub-switching current. The select circuit is electrically connected to the first sub-switching current generator and the second sub-switching current generator. According to a voltage level at the control node, the first sub-switching current or the second sub-switching current is selected by the select circuit so as to be provided to the control node.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 5B is table illustrating the actions of the select circuit according to the relationship between the voltage level at the control node and the reference voltage;

DETAILED DESCRIPTION OF PREFERRED EMBODIMENTS

Figure 1:
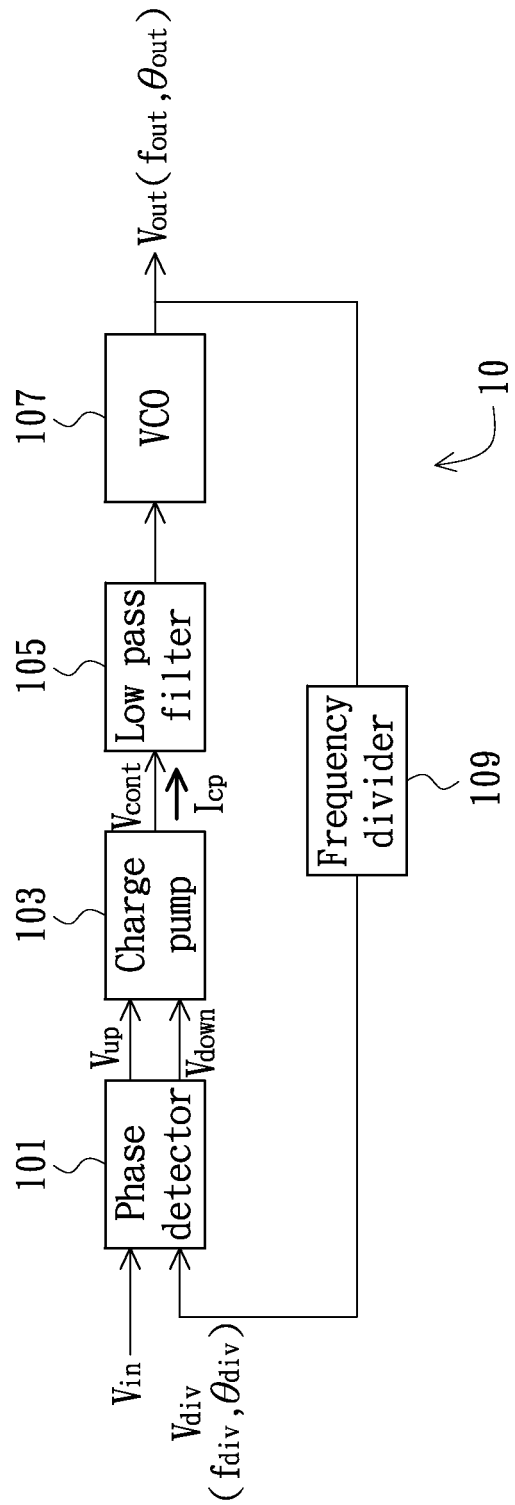
FIG. 1 is a schematic functional block diagram illustrating a conventional phase locked loop.

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

As known, the jitter and stability of the phase locked loop are affected by many parameters such as bandwidth (K), phase margin and damping factor. That is, these parameters can be used to evaluate the performance of the phase locked loop.

In designing the phase locked loop, the bandwidth K of the low pass filter is usually set to be smaller than or equal to one-tenth of the frequency of the input signal $V_{in}$. Moreover, in a case that a frequency divider is employed, the frequency of the output signal $V_{out}$ may be determined according to various combinations of the input signal $V_{in}$ and the division factor M used in the frequency divider. For example, for producing the output signal $V_{out}$ with a frequency of 1 GHz, the division factor M of the frequency divider is 100 and the frequency of the input signal $V_{in}$ is set to be 10 MHz. Alternatively, for producing the output signal $V_{out}$ with a frequency of 1 GHz, the division factor M of the frequency divider is 50 and the frequency of the input signal $V_{in}$ is set to be 20 MHz.

In other words, the output signal $V_{out}$ is dependent on the input signal $V_{in}$ and the division factor M. Moreover, the proportional relationship between the input signal $V_{in}$ and the bandwidth K should be taken into consideration.

As known, the bandwidth K of the low pass filter is in direct proportion to the charging/discharging current $I_{CP}$ flowing through the control node $S_{cont}$ of the charge pump. If the magnitude of the charging/discharging current $I_{CP}$ is increased, the bandwidth K of the low pass filter is increased. On the other hand, since the bandwidth K is in inverse proportion to the division factor M of the frequency divider, it is also deduced that the bandwidth K is in direct proportion to $I_{CP}/M$.

In views of the stability of the phase locked loop, during operation of the phase locked loop, the bandwidth K of the low pass filter needs to be maintained stable. Since the frequency of the output signal $V_{out}$ is often adjusted, the division factor M of the frequency divider needs to be correspondingly adjusted to maintain the bandwidth K of the low pass filter. Since the bandwidth K of the low pass filter is in direct proportion to $I_{CP}/M$, if the division factor M is adjusted, the magnitude of the charging/discharging current $I_{CP}$ generated at the control node $S_{cont}$ of the charge pump should be adjusted to maintain the bandwidth K of the low pass filter.

That is, in designing the phase locked loop, the influence of adjusting the division factor M on the bandwidth K may be compensated by the charging/discharging current $I_{CP}$. For example, if the division factor M is increased, the bandwidth K may be kept constant by increasing the charging/discharging current $I_{CP}$. Whereas, if the division factor M is decreased, the bandwidth K may be kept constant by decreasing the charging/discharging current $I_{CP}$.

For example, if the division factor M is in the range from 0 to 100, the bandwidth K may be set as 10. During the process of dynamically operating the phase locked loop, the bandwidth K may be varied. For keeping the bandwidth K constant, the influence of adjusting the division factor M and the bandwidth K may be compensated by the charging/discharging current $I_{CP}$.

Since the frequency of the output signal $V_{out}$ from the phase locked loop is adjusted, the division factor M of the frequency divider needs to be correspondingly adjusted. For keeping the bandwidth K constant, the charging/discharging current $I_{CP}$ outputted from the charge pump needs to be dynamically adjusted. Therefore, if the adjustable range of the charging/ discharging current $I_{CP}$ is increased, the flexibility of adjusting the division factor M and the bandwidth K will be enhanced.

Since the charging/discharging current $I_{CP}$ is an important factor to compensate the influence of adjusting the division factor M on the bandwidth K, the stability of the charging/discharging current $I_{CP}$ should be taken into consideration.

Please refer to FIG. 2A again. A first voltage difference $\Delta V_1$ between the voltage level at the first voltage terminal $V_1$ and the voltage level at the control node $S_{cont}$ is equivalent to the voltage drop $v_{DS,P}$ between the source and the drain of the PMOS transistor. A second voltage difference $\Delta V_2$ between the voltage level at the second voltage terminal $V_2$ and the voltage level at the control node $S_{cont}$ is equivalent to the voltage drop $v_{DS,N}$ between the source and the drain of the NMOS transistor.

Since the voltage level at the first voltage terminal $V_1$ (e.g. the voltage level at the voltage source $V_{dd}$) and the voltage level at the second voltage terminal $V_2$ (e.g. the voltage level at the ground terminal $V_{GND}$) are constant values, if the voltage level at the control node $S_{cont}$ is changed, the first voltage difference $\Delta V_1$, the second voltage difference $\Delta V_2$, the voltage drop $v_{DS,P}$ between the source and the drain of the PMOS transistor and the voltage drop $v_{DS,N}$ between the source and the drain of the NMOS transistor are changed.

Figure 3A:
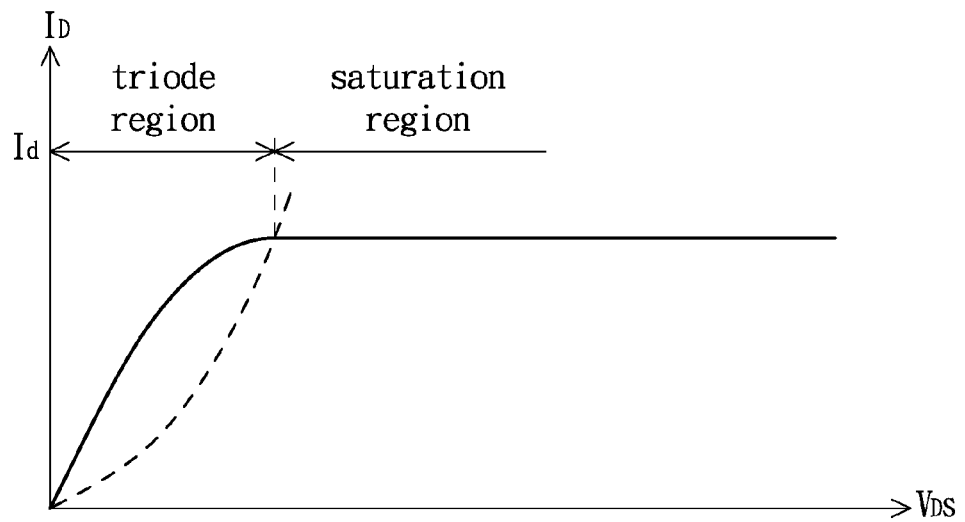
FIG. 3A is a plot illustrating the conducting current versus the voltage drop between the source and the drain of the NMOS transistor.

FIG. 3A is a plot illustrating the conducting current versus the voltage drop between the source and the drain of the NMOS transistor. If the voltage drop between the gate and the drain of the NMOS transistor is lower than the threshold voltage (i.e. $v_{GD-N} < V_{t-N}$), the NMOS transistor is operated in the cutoff region. Whereas, if the voltage drop between the gate and the drain of the NMOS transistor is higher than the threshold voltage (i.e. $v_{GD-N} > V_{t-N}$), the NMOS transistor may be operated in a triode region or a saturation region according to the voltage drop between the source and the drain, and the relationship between the voltage difference between the gate and the source and the threshold voltage.

The relationship between the conducting current and the voltage drop between the source and the drain of the NMOS transistor for the triode region and the saturation region will be illustrated in more details as follows.

If the voltage drop $v_{DS-N}$ between the source and the drain of the NMOS transistor, the voltage difference $v_{GS-N}$ between the gate and the source of the NMOS transistor and the threshold voltage $V_t$ comply with the relationship $v_{DS-N} < (v_{GS-N} - V_{t-N})$, the NMOS transistor is operated in the triode region. Under this circumstance, the conducting current flowing through the NMOS transistor may be expressed by the following formula:

$$i_{D-N} = k[2(v_{GS-N} - v_{t-N})v_{DS-N} - v_{DS-N}^2]$$

On the other hand, if the voltage drop $v_{DS-N}$ between the source and the drain of the NMOS transistor, the voltage difference $v_{GS-N}$ between the gate and the source of the NMOS transistor and the threshold voltage $V_{t-N}$ comply with the relationship $v_{DS-N} \geq (v_{GS-N} - V_{t-N})$, the NMOS transistor is operated in the saturation region. Under this circumstance, the conducting current flowing through the NMOS transistor may be expressed by the following formula:

$$i_{D-N} = k(v_{GS-N} - V_{t-n})^2(1 + \lambda_{DS-N}).$$

As previously described, if the voltage drop $V_{DS-N}$ between the source and the drain of the NMOS transistor is very small, the conducting current $i_D$ of the NMOS transistor is in direct proportion to the voltage drop $V_{DS-N}$ and also in direct proportion to the term $(V_{GS-N} - V_{t-N})$. In this situation, as shown in the triode region of FIG. 3A, the conducting current $i_D$ and the voltage drop $V_{DS-N}$ are in a linear relationship.

As the voltage drop $V_{DS-N}$ is gradually increased, the conducting current $i_D$ is no longer affected by the voltage drop $V_{DS-N}$. Meanwhile, as shown in FIG. 3A, the conducting current $i_D$ is substantially constant, and the NMOS transistor is operated in the saturation region.

In other words, the voltage drop between the source and the drain of the NMOS transistor may influence the magnitude of the conducting current $i_D$. Similarly, the magnitude of the conducting current $i_D$ and the operating region of the PMOS transistor are dependent on the voltage drop between the source and the drain of the PMOS transistor. The principles are similar to those of the NMOS transistor, and are not redundantly described herein.

Moreover, according to the above formulae related to the conducting current of the NMOS transistor and the PMOS transistor, the following events are realized. As the voltage level at the control node $S_{cont}$ is gradually increased, the first voltage difference $\Delta V_1$ is gradually decreased, but the second voltage difference $\Delta V_2$ is gradually increased. Under this circumstance, the voltage drop between the source and the drain of the PMOS transistor is gradually decreased, but the voltage drop between the source and the drain of the NMOS transistor is gradually increased.

As the voltage drop $V_{DS}$ between the source and the drain of the PMOS transistor is gradually decreased to an extent, the operating status of the PMOS transistor is switched from the saturation region to the triode region. Once the PMOS transistor is operated in the triode region, the current $I_P$ flowing through the PMOS transistor is gradually decreased and the PMOS transistor may even be turned off (in the cutoff region). Whereas, as the voltage drop $V_{DS}$ between the source and the drain of the NMOS transistor is gradually increased to an extent, the operating status of the PMOS transistor is switched from the triode region to the saturation region. Consequently, the magnitude of the current $I_N$ flowing through the NMOS transistor is increased.

Figure 3B:
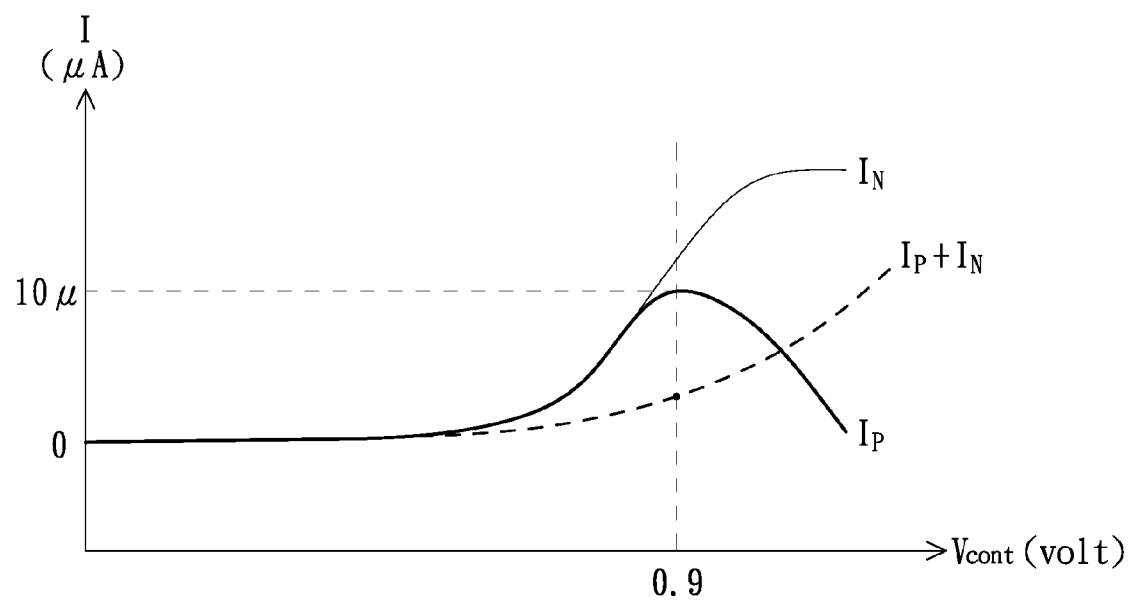
FIG. 3B is a plot illustrating the switching current of the PMOS transistor and the NMOS transistor versus the voltage level change of the control signal.

FIG. 3B is a plot illustrating the switching current of the PMOS transistor and the NMOS transistor versus the voltage level change of the control signal. As the voltage level at the control node $S_{cont}$ is gradually increased from the start point (0 volt), the first switching current $I_P$ and the second switching current $I_N$ are both increased.

As the voltage level at the control node $S_{cont}$ is continuously increased to a certain level (e.g. 0.9 volt), the first switching current $I_P$ generated by the PMOS transistor is increased to a maximum value and then gradually declined. Whereas, as the voltage level $V_{cont}$ at the control node $S_{cont}$ is continuously increased, the voltage drop $V_{DS}$ of the NMOS transistor is increased. Consequently, the NMOS transistor is still turned on, and the second switching current $I_N$ is continuously increased.

The sum of the first switching current $I_P$ and the second switching current $I_N$ is also shown in FIG. 3B. If the voltage level $V_{cont}$ at the control node $S_{cont}$ is lower than 0.9 volt, the net current outputted from the charge pump is nearly zero. Whereas, if the voltage level $V_{cont}$ at the control node $S_{cont}$ is greater than 0.9 volt, since the first switching current $I_P$ is insufficient to balance the second switching current $I_N$, the net charging/discharging current $I_{CP}$ (i.e. the sum of the first switching current $I_P$ and the second switching current $I_N$) is abruptly increased.

Since the flowing directions of the first switching current $I_P$ and the second switching current $I_N$ are opposed to each other, the sum of the first switching current $I_P$ and the second switching current $I_N$ (i.e. the current outputted from the charge pump to the control node $S_{cont}$) is equal to the difference of the absolute values of these two switching currents.

From the above discussions, as the voltage level $V_{cont}$ at the control node $S_{cont}$ is increased, the frequency $f_{out}$ of an output signal $V_{out}$ is increased. In addition, if the division factor M is increased, the frequency $f_{out}$ of the output signal $V_{out}$ is increased. Therefore, it is deduced that the voltage level $V_{cont}$ at the control node $S_{cont}$ is increased as the division factor M is increased.

Moreover, since the voltage level $V_{cont}$ at the control node $S_{cont}$ may affect the charging/discharging current, the magnitude of the charging/discharging current $I_{CP}$ is increased as the division factor M is increased. When the voltage level $V_{cont}$ at the control node $S_{cont}$ is greater than a certain level, the sum of the charging/discharging current is not zero because of the mismatch between the PMOS transistor and the NMOS transistor. That is, if the voltage level $V_{cont}$ at the control node $S_{cont}$ is greater than the certain level, the phase locked loop fails to be normally operated. Therefore, the present invention provides a charge pump for maintaining stability of the net charging/discharging current $I_{CP}$ without being considerably influenced by the voltage level change of the control voltage.

The present invention is to increase the operating range of the charge pump in response to the change of the voltage level $V_{cont}$ at the control node $S_{cont}$. Consequently, even if the voltage level $V_{cont}$ at the control node $S_{cont}$ is relatively high, the net charging/discharging current $I_{CP}$ at the control node $S_{cont}$ may be substantially kept constant without being adversely affected by the action of turning off the PMOS transistor. In such way, the flexibility of adjusting the charging/discharging current $I_{CP}$ is enhanced, so that the tolerance of the bandwidth change will be enhanced when the division factor is adjusted during operation of the phase locked loop.

Figure 4A:
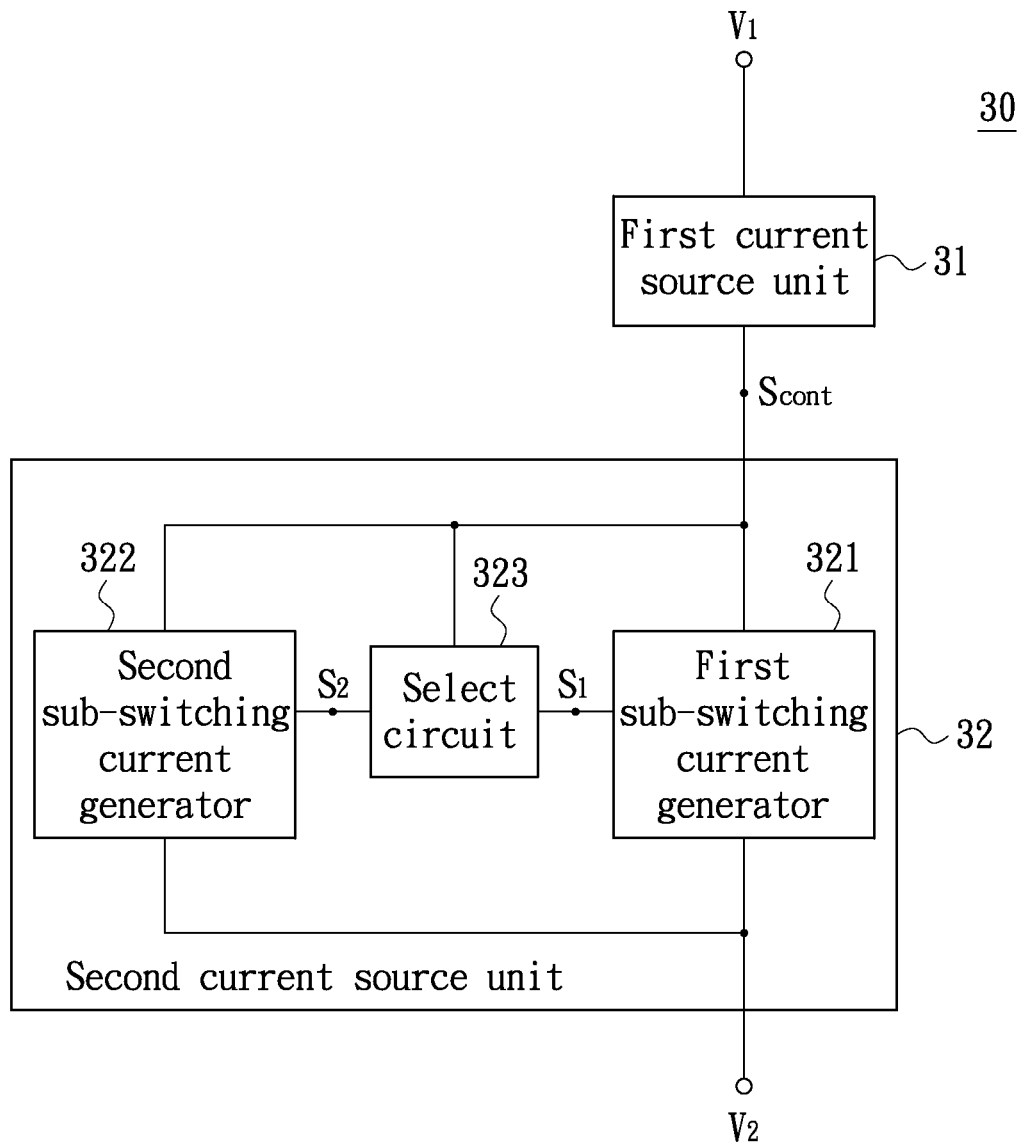
FIG. 4A is a schematic functional block diagram illustrating a charge pump according to an embodiment of the present invention.

FIG. 4A is a schematic functional block diagram illustrating a charge pump according to an embodiment of the present invention. In the charge pump 30, the current outputted from the control node $S_{cont}$ is controlled according to a phase comparing signal. As shown in FIG. 4A, the charge pump 30 includes a first current source unit 31 and a second current source unit 32. The first current source unit 31 is electrically connected between a first voltage terminal $V_1$ and the control node $S_{cont}$. The second current source unit 32 is electrically connected between the control node $S_{cont}$ and a second voltage terminal $V_2$. According to the phase comparing signal issued from the phase detector 101, one of the first current source unit 31 and the second current source unit 32 is selected to generate a charging/discharging current to the loss pass filter at the control node $S_{cont}$.

Figure 2A:
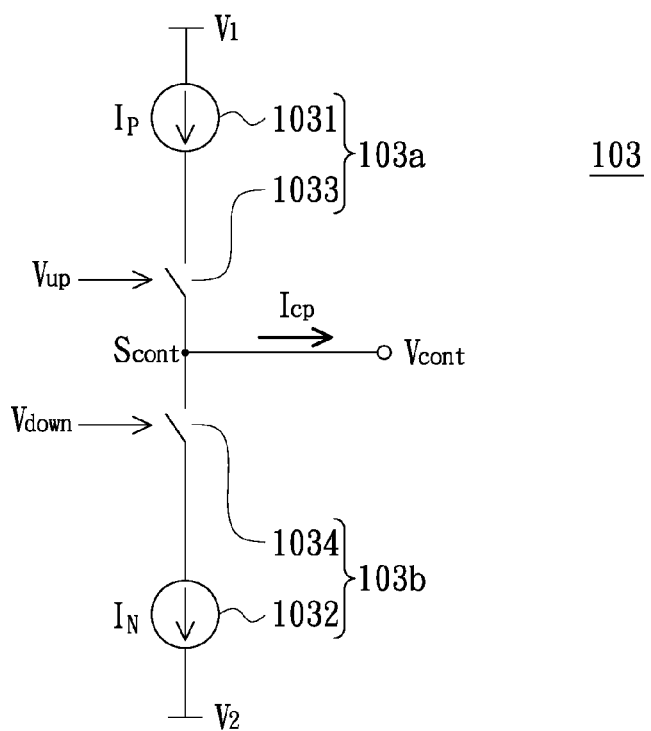
FIG. 2A is a schematic circuit diagram illustrating a charge pump used in the conventional phase locked loop.
Figure 2B:
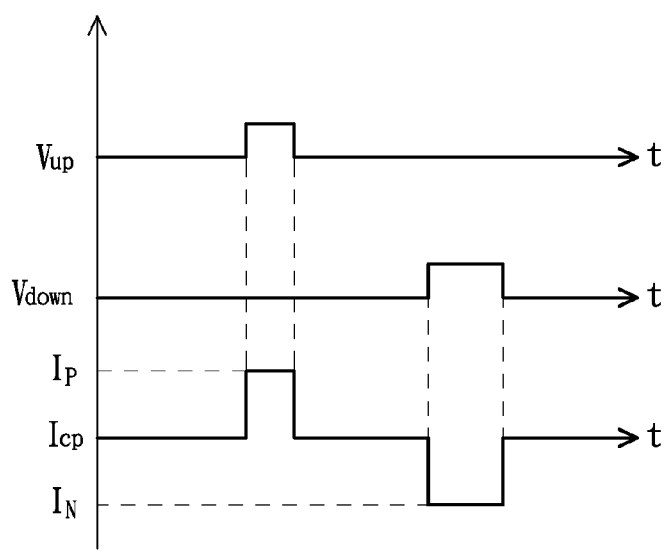
FIG. 2B is schematic timing waveform diagram illustrating the phase comparing signal outputted from the phase detector and the output current from the control node of the charge pump.

The configurations of the first current source unit 31 are similar to the first current source unit as shown in FIG. 2A. That is, the first current source unit 31 includes a first current source (not shown) and a first switch (not shown). The first current source is electrically connected to the voltage terminal $V_1$ for providing a constant current (i.e. a first switching current $I_P$). The first switch is electrically connected between the first current source and the control node $S_{cont}$. In response to high-level state of the first phase comparing signal $V_{up}$, the first switch is turned on, so that the first switching current $I_P$ is outputted from the control node $S_{cont}$.

Figure 4B:
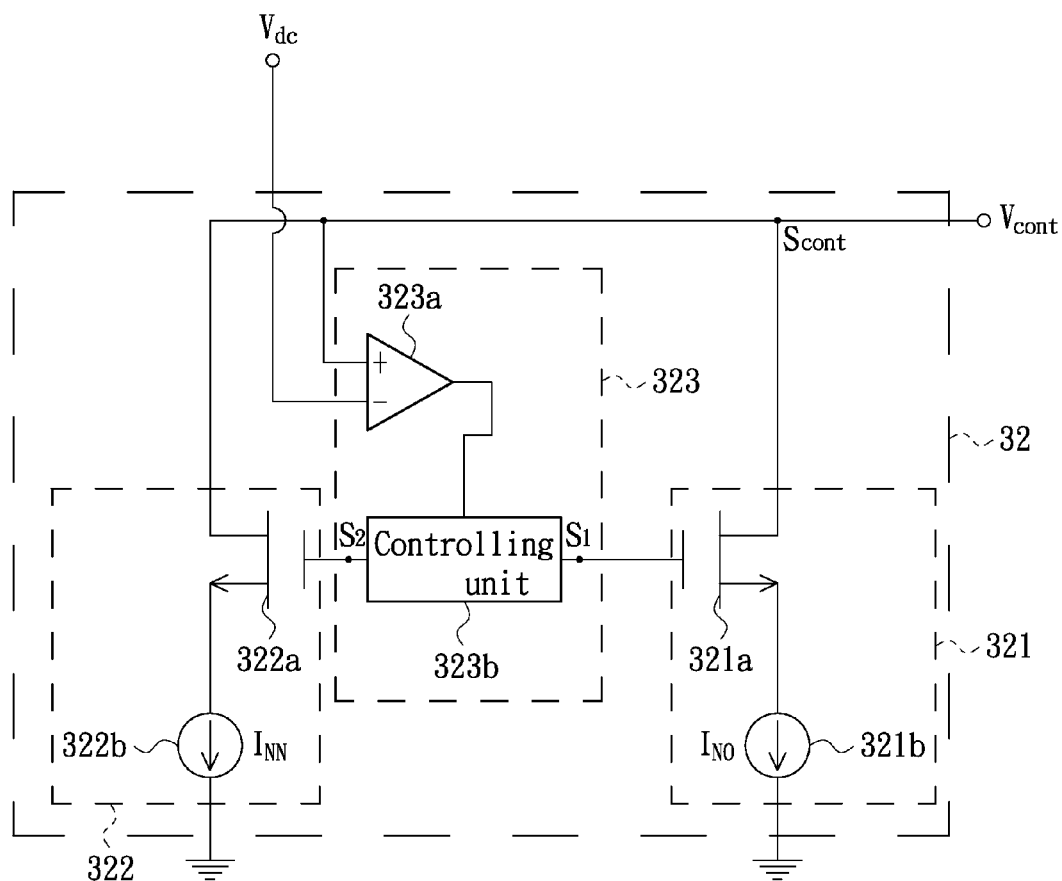
FIG. 4B is a schematic circuit diagram illustrating an exemplary second current source unit of the charge pump according to an embodiment of the present invention.

The second current source unit 32 is more diverse than the first current source unit 31. As shown in FIGS. 4A and 4B, the second current source unit 32 includes a first sub-switching current generator 321, a second sub-switching current generator 322 and a select circuit 323.

The first sub-switching current generator 321 and the second sub-switching current generator 322 are both electrically connected between the control node $S_{cont}$ and the second voltage terminal $V_2$. According to the voltage level at the control node $S_{cont}$, the first sub-switching current generator 321 generates a first sub-switching current $I_{NO}$. The second sub-switching current generator 322 is also electrically connected between the control node $S_{cont}$ and the second voltage terminal $V_2$. According to the voltage level at the control node $S_{cont}$, the second sub-switching current generator 322 generates a second sub-switching current $I_{NN}$. That is, the change of the voltage level at the control node $S_{cout}$ may determine whether the first sub-switching current $I_{NO}$ and the second sub-switching current $I_{NN}$ are generated or not.

The select circuit 323 is electrically connected to the first sub-switching current generator 321 and the second sub-switching current generator 322. According to a voltage level at the control node $S_{cout}$, the select circuit 323 will select the first sub-switching current $I_{NO}$ or the second sub-switching current $I_{NN}$ to be outputted from the control node $S_{cont}$.

The operation of how the select circuit 323 selects the outputted sub-switching current is varied from applications. For instance, the voltage difference between the voltage level at the control node $S_{cout}$ and the voltage at the second voltage terminal $V_2$ can be referred by the select circuit 323. In addition, the select circuit 323 may refer to the voltage difference between the voltage level at the control node $S_{cont}$ and a comparing voltage. According to the following embodiment, the select circuit 323 refers to the voltage difference between the voltage level at the control node $S_{cont}$ and the voltage at the second voltage terminal $V_2$.

That is, the select circuit 323 is configured to select a corresponding current to the control node $S_{cont}$, wherein the corresponding current is provided either from the first sub-switching current generator 321 or the second sub-switching current generator 322. Moreover, a reference voltage $V_{dc}$ may be determined by simulation. For example, the difference between the voltage level $V_{dd}$ of the voltage source and the possible minimum voltage drop $V_{sd}$ across the source and the drain (i.e. $V_{dd}-V_{sd}$) may be set as the reference voltage $V_{dc}$.

FIG. 4B is a schematic circuit diagram illustrating an exemplary second current source unit of the charge pump according to an embodiment of the present invention. In FIG. 4B, the configurations of the first sub-switching current generator 321, the second sub-switching current generator 322 and the select circuit 323 are shown.

The first sub-switching current generator 321 includes a first sub-switch 321a and a first sub-current source 321b. The first sub-switch 321a is electrically connected to the control node $S_{cont}$. If the voltage level $V_{cont}$ at the control node $S_{cont}$ is lower than the reference voltage $V_{dc}$, the first sub-switch 321a is turned on. The first sub-current source 321b is electrically connected between the second voltage terminal $V_2$ and the first sub-switch 321a. In a case that the first sub-switch 321a is turned on, the first sub-current source 321b provides the first sub-switching current $I_{NO}$ to the control node $S_{cont}$. That is, if the voltage level $V_{cont}$ at the control node $S_{cont}$ is lower than the reference voltage $V_{dc}$, the first sub-switching current generator 321 is selected by the select circuit 323 to provide the first sub-switching current $I_{NO}$.

The second sub-switching current generator 322 includes a second sub-switch 322a and a second sub-current source 322b. The second sub-switch 322a is electrically connected to the control node $S_{cont}$. If the voltage level $V_{cont}$ at the control node $S_{cont}$ is higher than the reference voltage $V_{dc}$, the second sub-switch 322a is turned on. The second sub-current source 322b is electrically connected between the second voltage terminal $V_2$ and the second sub-switch 322a. In a case that the second sub-switch 322a is turned on, the second sub-current source 322b provides the second sub-switching current $I_{NN}$ to the control node $S_{cont}$. That is, if the voltage level $V_{cont}$ at the control node $S_{cont}$ is higher than the reference voltage $V_{dc}$, the second sub-switching current generator 322 is selected by the select circuit 323 to provide the second sub-switching current $I_{NN}$.

The select circuit 323 includes a comparator 323a and a controlling unit 323b. The comparator 323a is electrically connected to the control node $S_{cont}$. The controlling unit 323b is electrically connected to the first sub-switch 321a and the second sub-switch 322a. The two input ends of the comparator 323a are electrically connected to the control node $S_{cont}$ and the reference voltage $V_{dc}$, respectively. By comparing the voltage level $V_{cont}$ at the control node $S_{cont}$ with the reference voltage $V_{dc}$, a voltage comparing signal $V_{cmp}$ is outputted from the comparator 323a. According to the voltage comparing signal $V_{cmp}$, the first sub-switching current generator 321 or the second sub-switching current generator 322 is selected to provide the first sub-switching current $I_{NO}$ or the second sub-switching current $I_{NN}$.

Figure 5A:
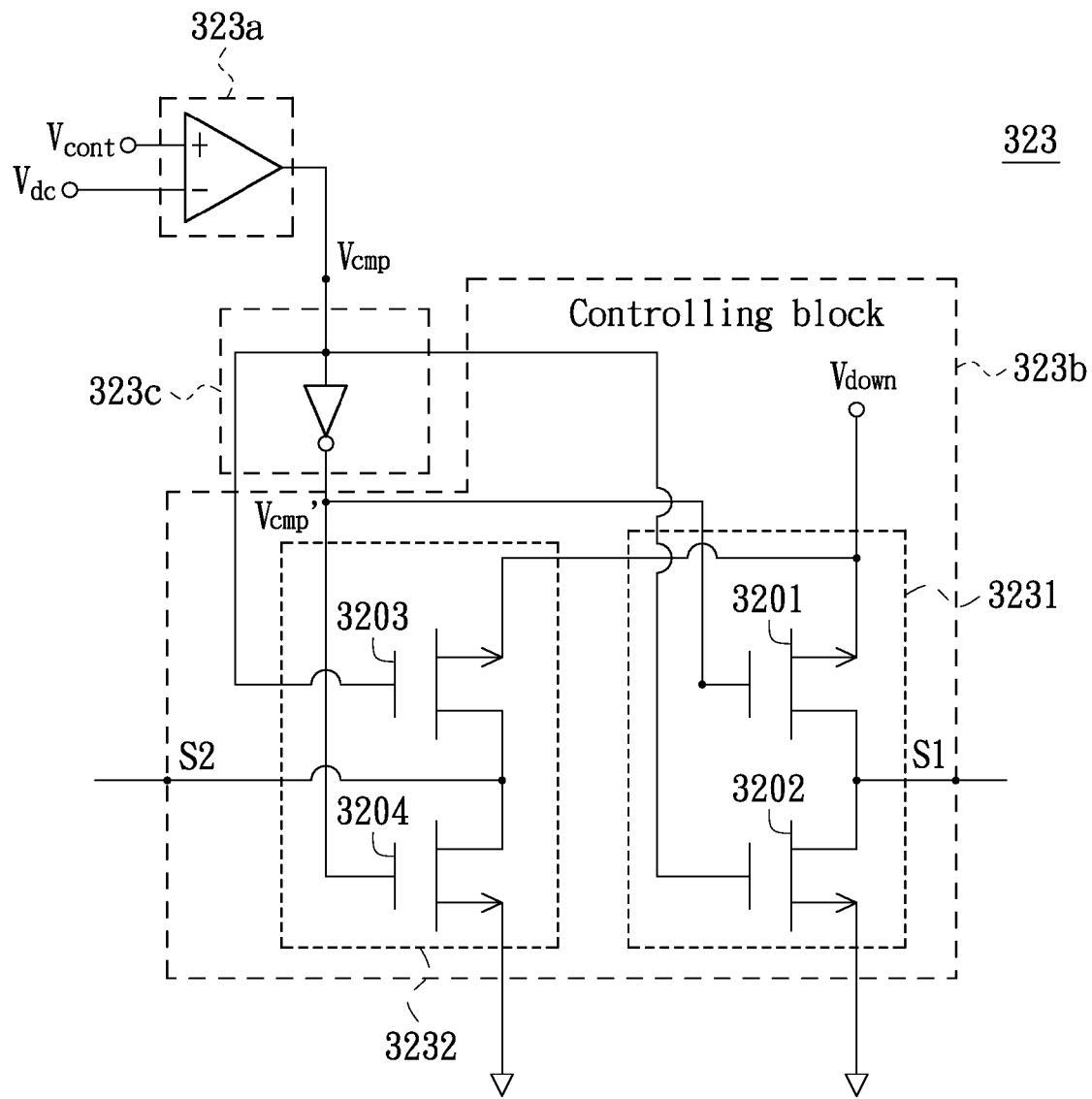
FIG. 5A is a schematic circuit diagram illustrating an exemplary select circuit of the second current source unit of the charge pump according to an embodiment of the present invention.

FIG. 5A is a schematic circuit diagram illustrating an exemplary select circuit of the second current source unit of the charge pump according to an embodiment of the present invention. In addition to the comparator 323a and the controlling unit 323b, the select circuit 323 further includes an inverter 323c. The inverter 323c is electrically connected between the comparator 323a and the controlling unit 323b. By the inverter 323c, the voltage comparing signal $V_{cmp}$ is inverted into an inverted voltage comparing signal $V_{cmp'}$, which is a complement value of the voltage comparing signal $V_{cmp}$. The inverted voltage comparing signal $V_{cmp'}$ is then transmitted to the controlling unit 323b.

In response to the change of the voltage level $V_{cont}$ at the control node $S_{cont}$, different sub-switching current generators are enabled by the voltage comparing signal $V_{cmp}$ and the inverted voltage comparing signal $V_{cmp'}$.

For example, if the voltage level $V_{cont}$ at the control node $S_{cont}$ is lower than the reference voltage $V_{dc}$, the voltage comparing signal $V_{cmp}$ is 0 volt. That is, the logic state of the voltage comparing signal $V_{cmp}$ is 0, and the logic state of its complement value is 1. Under this circumstance, the charge pump 30 generates the first sub-switching current $I_{NO}$. Whereas, if the voltage level $V_{cont}$ at the control node $S_{cont}$ is higher than the reference voltage $V_{dc}$, the voltage comparing signal $V_{cmp}$ is substantially equal to the voltage level of the first voltage terminal $V_{dd}$. That is, the logic state of the voltage comparing signal $V_{cmp}$ is 1, and the logic state of its complement value is 0. Under this circumstance, the charge pump 30 generates the second sub-switching current $I_{NN}$.

The controlling unit 323b includes a first controlling block 3231 and a second controlling block 3232. The first controlling block 3231 is electrically connected to the comparator 323a and the first sub-switching current generator 321. The second controlling block 3232 is electrically connected to the comparator 323a and the second sub-switching current generator 322. The first controlling block 3231 is configured to select the first sub-switching current generator 321 to generate the first sub-switching current $I_{NO}$. The second controlling block 3232 is configured to select the second sub-switching current generator 322 to generate the second sub-switching current $I_{NN}$. That is, according to the voltage comparing signal $V_{cmp}$ and the inverted voltage comparing signal $V_{cmp'}$, the controlling unit 323b will select the first sub-switching current generator 321 or the second sub-switching current generator 322 to provide the first sub-switching current $I_{NO}$ or the second sub-switching current $I_{NN}$.

According to the voltage comparing signal $V_{cmp}$, the first controlling block 3231 issues a first control signal. In response to the first control signal, the first sub-switch 321a of the first sub-switching current generator 321 is turned on, and thus the first sub-switching current $I_{NO}$ is generated. According to the inverted voltage comparing signal $V_{cmp'}$, the second controlling block 3232 issues a second control signal. In response to the second control signal, the second sub-switch 322a of the second sub-switching current generator 322 is turned on, and thus the second sub-switching current $I_{NN}$ is generated.

The first controlling block 3231 includes a first semiconductor switch 3201 and a second semiconductor switch 3202. The gate of the first semiconductor switch 3201 is electrically connected to the inverted voltage comparing signal $V_{cmp'}$. The gate of the second semiconductor switch 3202 is electrically connected to the voltage comparing signal $V_{cmp}$.

The two conducting terminals of the first semiconductor switch 3201 are electrically connected to the second phase comparing signal $V_{down}$ and the gate of the first sub-switch 321a, respectively. In a case that the first semiconductor switch 3201 is turned on and conducted, the voltage level of the second phase comparing signal $V_{down}$ is transmitted to the gate of the first sub-switch 321a. Consequently, the first sub-switching current $I_{NO}$ is provided to the control node $S_{cont}$.

The two conducting terminals of the second semiconductor switch 3202 are electrically connected to the gate of the first sub-switch 321a and the second voltage terminal $V_2$. In a case that the second semiconductor switch 3202 is turned on and conducted, the voltage level of the second voltage terminal $V_2$ (i.e. $V_{GND}$) is transmitted to the gate of the first sub-switch 321a. Consequently, the first sub-switching current generator 321 stops providing the first sub-switching current $I_{NO}$ to the control node $S_{cont}$.

The second controlling block 3232 includes a third semiconductor switch 3203 and a fourth semiconductor switch 3204. The gate of the third semiconductor switch 3203 is electrically connected to the voltage comparing signal $V_{cmp}$. The gate of the fourth semiconductor switch 3204 is electrically connected to the inverted voltage comparing signal $V_{cmp'}$.

The two conducting terminals of the third semiconductor switch 3203 are electrically connected to the second phase comparing signal $V_{down}$ and the gate of the second sub-switch 322a, respectively. In a case that the third semiconductor switch 3203 is turned on and conducted, the voltage level of the second phase comparing signal $V_{down}$ is transmitted to the gate of the second sub-switch 322a. Consequently, the second sub-switching current $I_{NN}$ is provided to the control node $S_{cont}$.

The two conducting terminals of the fourth semiconductor switch 3204 are electrically connected to the gate of the second sub-switch 322a and the second voltage terminal $V_2$. In a case that the fourth semiconductor switch 3204 is turned on and conducted, the voltage level of the second voltage terminal $V_2$ (i.e. $V_{GND}$) is transmitted to the gate of the second sub-switch 322a. Consequently, the second sub-switching current generator 322 stops providing the second sub-switching current $I_{NN}$ to the control node $S_{cont}$.

Please refer to FIG. 5A again. The voltage comparing signal $V_{cmp}$ is electrically connected to the second semiconductor switch 3202 and the third semiconductor switch 3203. The inverted voltage comparing signal $V_{cmp'}$ is electrically connected to the first semiconductor switch 3201 and the fourth semiconductor switch 3204. The connection between the voltage comparing signal $V_{cmp}$ or the inverted voltage comparing signal $V_{cmp'}$ and the first controlling block 3231 or the second controlling block 3232 is not restricted. Since the comparator 323a has an positive input end and a negative input end and the connection between these two input ends and the control node $S_{cont}$ and the reference voltage $V_{dc}$ may be changed, the voltage comparing signal $V_{cmp}$ outputted from the comparator 323a is changeable.

FIG. 5B is table illustrating the actions of the select circuit according to the relationship between the voltage level at the control node and the reference voltage. In an embodiment, the voltage level at the second voltage terminal $V_2$ is 0 volt. The positive input end of the comparator 323a is electrically connected to the control node $S_{cont}$. The negative input end of the comparator 323a is electrically connected to the reference voltage $V_{dc}$. It is noted that the connection of these two input ends of the comparator 323a may vary.

If the voltage level $V_{cont}$ at the control node $S_{cont}$ is lower than the reference voltage $V_{dc}$ ($V_{cont}<V_{dc}$), the voltage comparing signal $V_{cmp}$ outputted from the comparator 323a is 0 volt. The logic state of the voltage comparing signal $V_{cmp}$ is 0, and the logic state of the inverted voltage comparing signal $V_{cmp'}$ is 1.

Since the gate of the first semiconductor switch 3201 of the first controlling block 3231 is electrically connected to the inverted voltage comparing signal $V_{cmp'}$, the first semiconductor switch 3201 is turned on. Since the gate of the second semiconductor switch 3202 of the first controlling block 3231 is electrically connected to the voltage comparing signal $V_{cmp}$, the second semiconductor switch 3202 is turned off. As the first semiconductor switch 3201 is turned on, the voltage level at the first node S1 is equal to the voltage level of the second phase comparing signal $V_{down}$.

Since the gate of the third semiconductor switch 3203 of the second controlling block 3232 is electrically connected to the voltage comparing signal $V_{cmp}$, the third semiconductor switch 3203 is turned off. Since the gate of the fourth semiconductor switch 3204 of the second controlling block 3232 is electrically connected to inverted voltage comparing signal $V_{cmp'}$, the fourth semiconductor switch 3204 is turned on. As the fourth semiconductor switch 3204 is turned on, the voltage level at the second node S2 is equal to the voltage level at the second voltage terminal $V_2$ (i.e. 0 volt).

From the above discussions, if the voltage level $V_{cont}$ at the control node $S_{cont}$ is lower than the reference voltage $V_{dc}$, the voltage level at the first node S1 is equal to the voltage level of the second phase comparing signal $V_{down}$ and the voltage level at the second node S2 is 0 volt. Consequently, the first sub-switch 321a connected to the first node S1 is turned on, and the second sub-switch 322a connected to the second node S2 is turned off. Under this circumstance, the second current source unit 32 only provides the first sub-switching current $I_{NO}$ but does not provide the second sub-switching current $I_{NN}$.

On the other hand, if the voltage level $V_{cont}$ at the control node $S_{cont}$ is higher than the reference voltage $V_{dc}$ ($V_{cont}>V_{dc}$), the voltage comparing signal $V_{cmp}$ outputted from the comparator 323a is $V_{dd}$. The logic state of the voltage comparing signal $V_{cmp}$ is 1, and the logic state of the inverted voltage comparing signal $V_{cmp'}$ is 0.

Since the gate of the first semiconductor switch 3201 of the first controlling block 3231 is electrically connected to the inverted voltage comparing signal $V_{cmp'}$ (logic level "0"), the first semiconductor switch 3201 is turned off. Since the gate of the second semiconductor switch 3202 of the first controlling block 3231 is electrically connected to the voltage comparing signal $V_{cmp}$ (logic level "1"), the second semiconductor switch 3202 is turned on. As the second semiconductor switch 3202 is turned on, the voltage level at the first node S1 is equal to the voltage level at the second voltage terminal $V_2$ (i.e. 0 volt).

Since the gate of the third semiconductor switch 3203 of the second controlling block 3232 is electrically connected to the voltage comparing signal $V_{cmp}$ (logic level "1"), the third semiconductor switch 3203 is turned on. Since the gate of the fourth semiconductor switch 3204 of the second controlling block 3232 is electrically connected to inverted voltage comparing signal $V_{cmp'}$ (logic level "0"), the fourth semiconductor switch 3204 is turned off. As the third semiconductor switch 3203 is turned on, the voltage level at the second node S2 is equal to the voltage level of the second phase comparing signal $V_{down}$.

From the above discussions, if the voltage level $V_{cont}$ at the control node $S_{cont}$ is higher than the reference voltage $V_{dc}$, the voltage level at the first node S1 is 0 volt and the voltage level at the second node S2 is equal to the voltage level of the second phase comparing signal $V_{down}$. Consequently, the first sub-switch 321a connected to the first node S1 is turned off, and the second sub-switch 322a connected to the second node S2 is turned on. Under this circumstance, the second current source unit 32 only provides the second sub-switching current $I_{NN}$ but does not provide the first sub-switching current $I_{NO}$.

Figure 6:
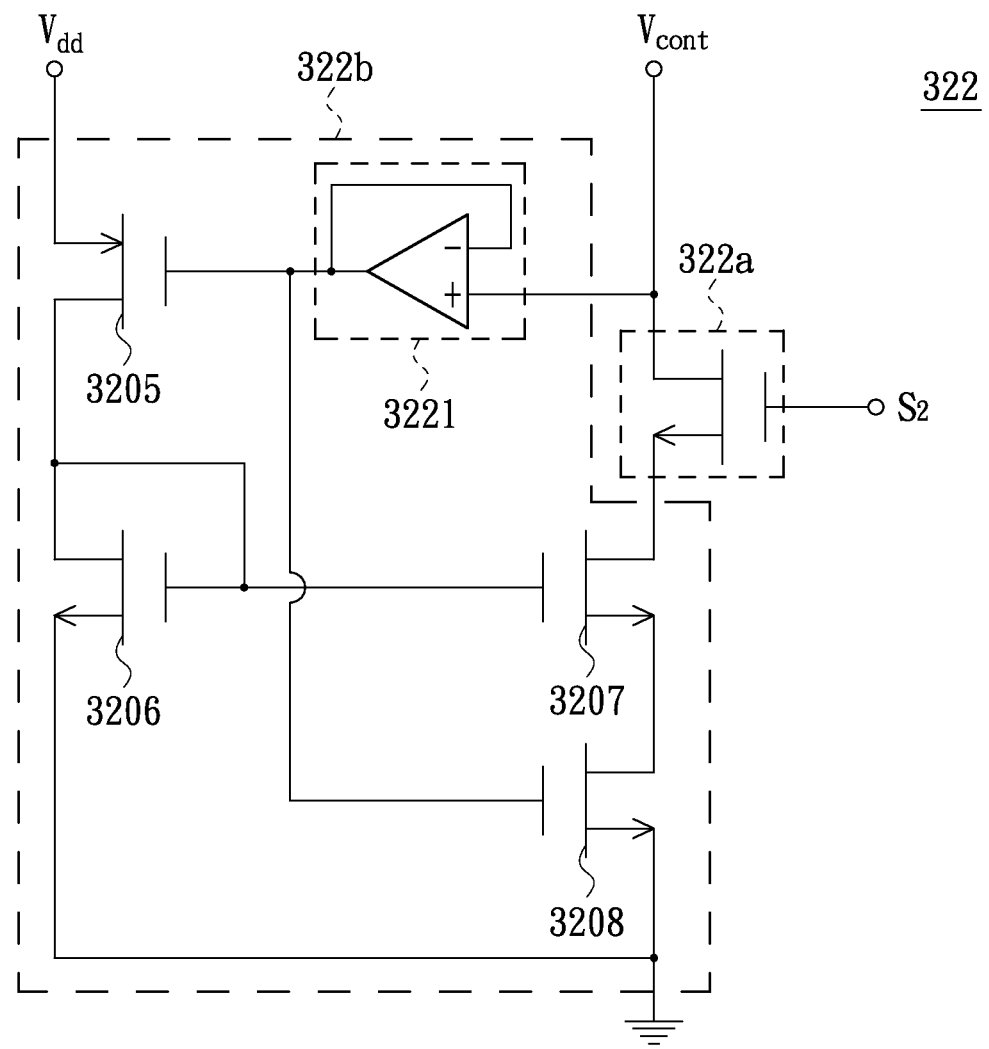
FIG. 6 is a schematic circuit diagram illustrating an exemplary second sub-switching current generator of the second current source unit of the charge pump according to an embodiment of the present invention.

FIG. 6 is a schematic circuit diagram illustrating an exemplary second sub-switching current generator of the second current source unit of the charge pump according to an embodiment of the present invention. As shown in FIG. 6, the second sub-switching current generator 322 includes a current mirror, which are composed of four semiconductor switches 3205~3208. Through the second sub-switch 322a, the reference current copied by the current mirror is transmitted to the control node $S_{cont}$.

Through a negative feedback amplifier 3221, the voltage level $V_{cont}$ at the control node $S_{cont}$ is transmitted to the gate of the fifth semiconductor switch 3205. The conducting current is reflected by the current mirror to be served as the second sub-switching current $I_{NN}$.

Figure 7A:
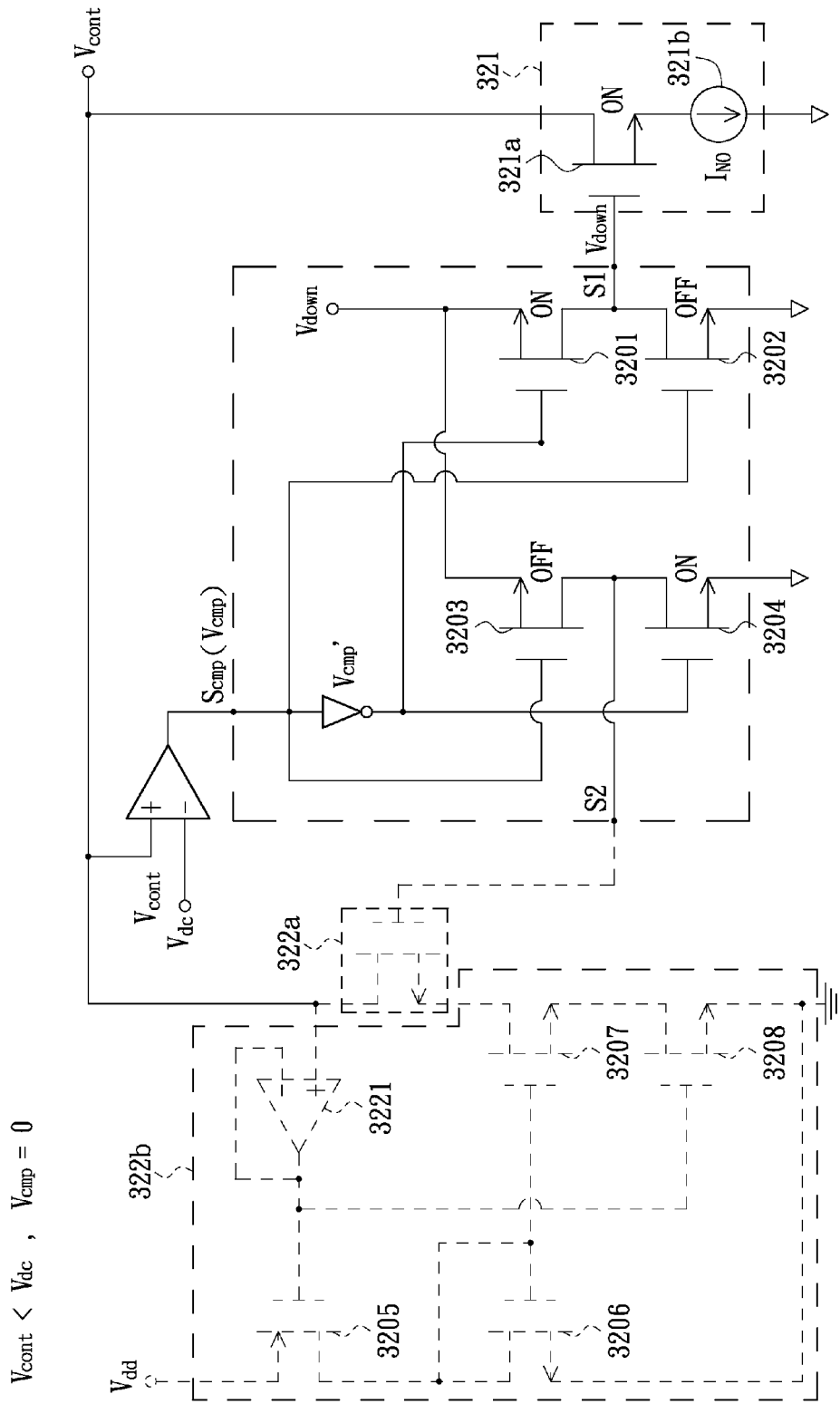
FIG. 7A is a schematic circuit diagram illustrating the actions of the semiconductor switches and the voltage changes of some nodes in the second current source unit in a case that the voltage level at the control node is lower than the reference voltage.
Figure 7B:
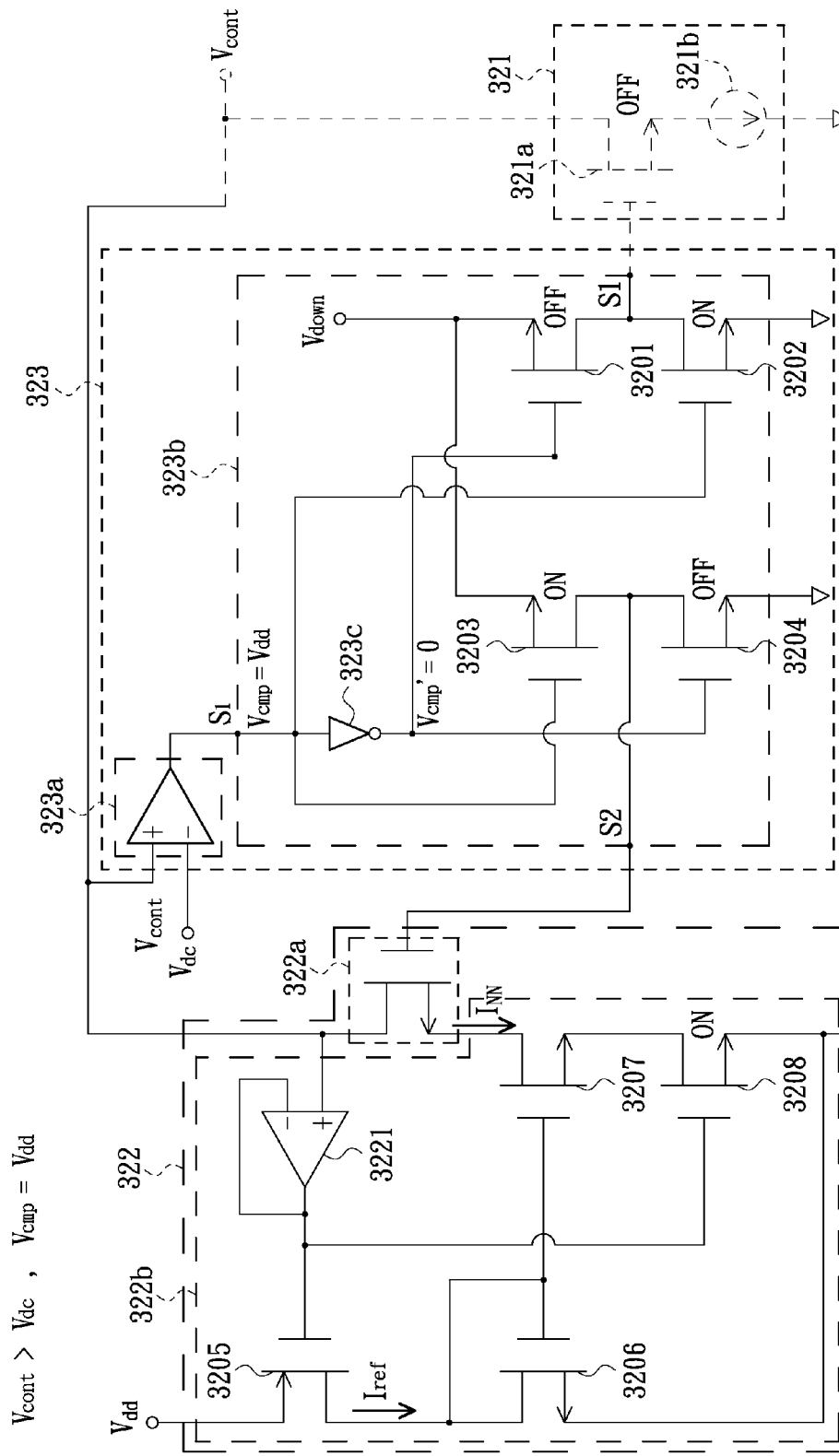
FIG. 7B is a schematic circuit diagram illustrating the actions of the semiconductor switches and the voltage changes of some nodes in the second current source unit in a case that the voltage level at the control node is higher than the reference voltage.

FIG. 7A is a schematic circuit diagram illustrating the actions of the semiconductor switches and the voltage changes of some nodes in the second current source unit 32 in a case that the voltage level $V_{cont}$ at the control node $S_{cont}$ is lower than the reference voltage $V_{dc}$. FIG. 7B is a schematic circuit diagram illustrating the actions of the semiconductor switches and the voltage changes of some nodes in the second current source unit 32 in a case that the voltage level $V_{cont}$ at the control node $S_{cont}$ is higher than the reference voltage $V_{dc}$.

Please refer to FIGS. 5A, 5B and 7A. If the voltage level $V_{cont}$ at the control node $S_{cont}$ is lower than the reference voltage $V_{dc}$, the voltage comparing signal $V_{cmp}$ is 0 volt. Consequently, the second semiconductor switch 3202 and the third semiconductor switch 3203 connected to the voltage comparing signal $V_{cmp}$ are turned off. The voltage level of the inverted voltage comparing signal $V_{cmp'}$ is $V_{dd}$. Consequently, the first semiconductor switch 3201 and the fourth semiconductor switch 3204 connected to the inverted voltage comparing signal $V_{cmp'}$ are turned on.

Since the first semiconductor switch 3201 and the fourth semiconductor switch 3204 are turned on and conducted, the second phase comparing signal $V_{down}$ is transmitted to the first sub-switching current generator 321 through the first semiconductor switch 3201, and the voltage $V_{GND}$ is transmitted to the second sub-switching current generator 322 through the fourth semiconductor switch 3204. Under this circumstance, the first sub-switching current $I_{NO}$ generated by the first sub-current source 321b is outputted to the control node $S_{cont}$. However, the second sub-switching current $I_{NN}$ is not outputted to the control node $S_{cont}$. For clarification, the second sub-switching current generator 322 is circumscribed by dashed lines to indicate that the second sub-switching current generator 322 does not provide current to the control node $S_{cont}$.

Please refer to FIGS. 5A, 5B and 7B. If the voltage level $V_{cont}$ at the control node $S_{cont}$ is higher than the reference voltage $V_{dc}$, the voltage level of the voltage comparing signal $V_{cmp}$ is $V_{dd}$. Consequently, the second semiconductor switch 3202 and the third semiconductor switch 3203 connected to the voltage comparing signal $V_{cmp}$ are turned on. The voltage level of the inverted voltage comparing signal $V_{cmp'}$ is 0 volt. Consequently, the first semiconductor switch 3201 and the fourth semiconductor switch 3204 connected to the inverted voltage comparing signal $V_{cmp'}$ are turned off.

Since the second semiconductor switch 3202 and the third semiconductor switch 3203 are turned on and conducted, the voltage $V_{GND}$ is transmitted to the first sub-switching current generator 321 through the second semiconductor switch 3202, and the second phase comparing signal $V_{down}$ is transmitted to the second sub-switching current generator 322 through the third semiconductor switch 3203. Under this circumstance, the first sub-switching current $I_{NO}$ generated by the first sub-current source 321b is not outputted to the control node $S_{cont}$. However, the second sub-switching current $I_{NN}$ is outputted to the control node $S_{cont}$. For clarification, the first sub-switching current generator 321 is circumscribed by dashed lines to indicate that the first sub-switching current generator 321 does not provide current to the control node $S_{cont}$.

Due to the inherent difference between the PMOS transistor and the NMOS transistor, the charging/discharging current outputted from the charge pump may be suffered from a mismatched problem. Since the current source of the discharging current can be dynamically selected according to the voltage level $V_{cont}$ at the control node $S_{cont}$ by using the charge pump of the present invention, even if the voltage level $V_{cont}$ at the control node $S_{cont}$ is very high, the conducting current flowing through the PMOS transistor is not too small.

In other words, as the voltage level $V_{cont}$ at the control node $S_{cont}$ is increased, the current source of the discharging current provided by the second current source unit 32 is correspondingly changed. In a case that the voltage level $V_{cont}$ at the control node $S_{cont}$ is relatively low, the first sub-switching current generator 321 is selected to provide the first sub-switching current $I_{NO}$. Whereas, as the voltage level $V_{cont}$ at the control node $S_{cont}$ is increased to a certain level, the second sub-switching current generator 322 is selected to provide the second sub-switching current $I_{NN}$. In such way, the mismatch current problem resulting from the inherent difference between the PMOS transistor and the NMOS transistor will be overcome.

Figure 8:
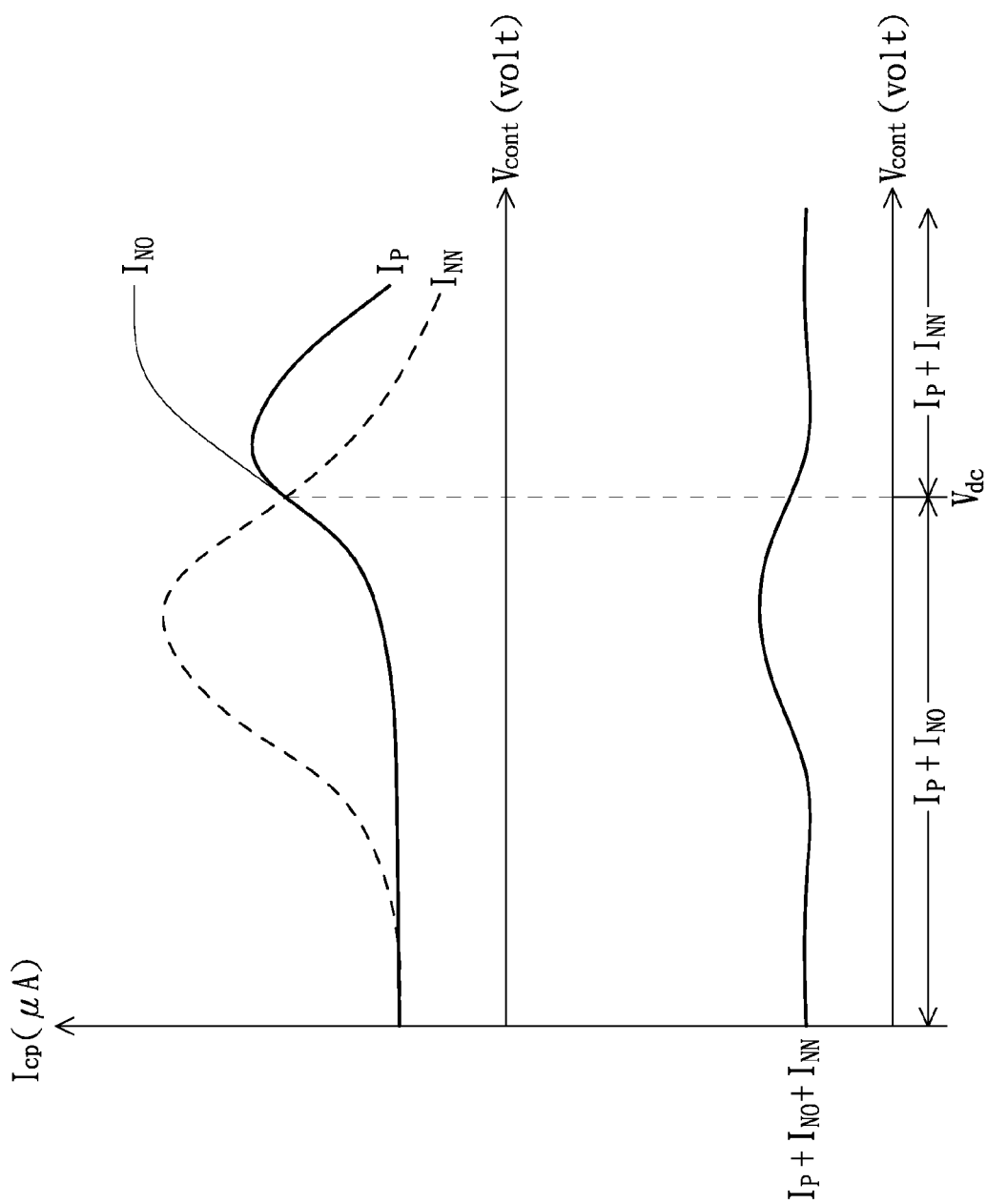
FIG. 8 is a plot illustrating the conducting current provided by the charge pump versus the voltage level at the control node according to an embodiment of the present invention.

FIG. 8 is a plot illustrating the conducting current provided by the charge pump versus the voltage level at the control node according to an embodiment of the present invention.

In the upper part of FIG. 8, the first switching current $I_P$, the first sub-switching current $I_{NO}$ and the second sub-switching current $I_{NN}$ corresponding to the voltage level $V_{cont}$ at the control node $S_{cont}$ are shown. Like the plot shown in FIG. 3B, if the voltage level $V_{cont}$ at the control node $S_{cont}$ is higher than the reference voltage $V_{dc}$, the first switching current $I_P$ is increased to a maximum value and then gradually declined. Similarly, if the voltage level $V_{cont}$ at the control node $S_{cont}$ is higher than the reference voltage $V_{dc}$, the first sub-switching current $I_{NO}$ provided by the first sub-switching current generator 321 is continuously increased.

As the voltage level $V_{cont}$ at the control node $S_{cont}$ is gradually increased, the second sub-switching current $I_{NN}$ provided by the second sub-switching current generator 322 is gradually increased and then gradually declined. In accordance with a key feature of the present invention, the magnitude of the first sub-switching current $I_{NO}$ is compensated by the second sub-switching current $I_{NN}$. Consequently, even if the voltage level $V_{cont}$ at the control node $S_{cont}$ is higher than the reference voltage $V_{dc}$, the mismatch current problem resulting from the inherent difference between the PMOS transistor and the NMOS transistor will be overcome.

In the lower part of FIG. 8, a net current (i.e. the sum of the first switching current $I_P$, the first sub-switching current $I_{NO}$ and the second sub-switching current $I_{NN}$) corresponding to the voltage level $V_{cont}$ at the control node $S_{cont}$ is shown.

That is, the first sub-switching current $I_{NO}$ and the second sub-switching current $I_{NN}$ with different characteristics are provided by the NMOS transistor. In a case that the voltage level $V_{cont}$ at the control node $S_{cont}$ is lower than the reference voltage $V_{dc}$, the first sub-switching current $I_{NO}$ is provided. Whereas, in a case that the voltage level $V_{cont}$ at the control node $S_{cont}$ is higher than the reference voltage $V_{dc}$, the second sub-switching current $I_{NN}$ is provided.

In a case that the voltage level $V_{cont}$ at the control node $S_{cont}$ is lower than the reference voltage $V_{dc}$, the first sub-switching current generator 321 and the first current source unit 31 are collaboratively employed. Under this circumstance, the net charging/discharging current $I_{CP}$ generated by the charge pump 30 is equivalent to the sum of the first switching current $I_P$ and the first sub-switching current $I_{NO}$, i.e. $I_{CP}=I_P+I_{NO}$.

Whereas, in a case that the voltage level $V_{cont}$ at the control node $S_{cont}$ is higher than the reference voltage $V_{dc}$, the second sub-switching current generator 322 and the first current source unit 31 are collaboratively employed. Under this circumstance, the net charging/discharging current $I_{CP}$ generated by the charge pump 30 is equivalent to the sum of the first switching current $I_P$ and the second sub-switching current $I_{NN}$, i.e. $I_{CP}=I_P+I_{NN}$.

As the frequency of the output signal generated by the phase locked loop is increased, the magnitude of the charging/discharging current outputted from the control node $S_{cont}$ is increased, and the control voltage applied to the voltage control oscillator is increased. In other words, the voltage inputted into the voltage control oscillator is fed back and adjusted according to the voltage level of the second phase comparing signal $V_{down}$. An approach for achieving this purpose is to decrease the second switching current $I_N$ flowing through the NMOS transistor. That is, if the voltage level $V_{cont}$ at the control node $S_{cont}$ is higher than the reference voltage $V_{dc}$, the current flows through another path. In such way, the phase locked loop can be operated in a wider bandwidth.

Ideally, the output voltage of the phase locked loop may be tracked on a specified frequency. During the tracking process, the voltage level $V_{cont}$ at the control node $S_{cont}$ is possibly changed. Once the voltage level $V_{cont}$ at the control node $S_{cont}$ is higher than the reference voltage $V_{dc}$, the circuit behavior of the phase locked loop may become divergent.

From the above description, the charge pump of the present invention can maintain the stability of the net charging/discharging current even if the variation of the voltage level $V_{cont}$ at the control node $S_{cont}$ is large. Consequently, the adverse influence on the output signal $V_{out}$ and the division factor M because of the inherent difference between the PMOS transistor and the NMOS transistor will be minimized.

Moreover, since the magnitude of the current flowing through the PMOS transistor of the charge pump and the magnitude of the current flowing through the NMOS transistor of the charge pump are substantially identical, the net charging/discharging current $I_{CP}$ is close to zero even if the voltage level $V_{cont}$ at the control node $S_{cont}$ is high. In other words, by using the charge pump of the present invention, the adjustable range of the charging/discharging current $I_{CP}$ is increased. Since the adjustable range of the charging/discharging current $I_{CP}$ is increased, if the voltage level $V_{cont}$ at the control node $S_{cont}$ is very large, the phase locked loop can be effectively tracked. In addition, the influence of adjusting the division factor M on the bandwidth K will be minimized. As a consequence, the performance of the phase locked loop will be enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A charge pump for providing a current to a control node according to a phase comparing signal, the charge pump comprising:
    a first current source unit, electrically connected between a first voltage terminal and the control node, wherein the first current source unit provides a first switching current to the control node according to the phase comparing signal; and
    a second current source unit, electrically connected between the control node and a second voltage terminal, comprising:
        a first sub-switching current generator, electrically connected to the control node and the second voltage terminal, wherein the first sub-switching current generator generates a first sub-switching current according to the phase comparing signal;
        a second sub-switching current generator electrically connected to the control node and the second voltage terminal, wherein the second sub-switching current generator generates a second sub-switching current according to the phase comparing signal; and
        a select circuit electrically connected to the first sub-switching current generator and the second sub-switching current generator, wherein according to a voltage level at the control node, either the first sub-switching current or the second sub-switching current is selected by the select circuit so as to be provided to the control node.

2. The charge pump according to claim 1, wherein the first current source unit comprises:
    a first switch electrically connected to the control node, wherein the first switch is turned on according to the phase comparing signal; and
    a first current source electrically connected to the first voltage terminal and the first switch, wherein when the first switch is turned on, the first current source provides the first switching current to the control node.

3. The charge pump according to claim 1, wherein the first sub-switching current generator comprises:
    a first sub-switch electrically connected to the control node, wherein if the voltage level at the control node is lower than a reference voltage, the first sub-switch is turned on; and
    a first sub-current source electrically connected between the second voltage terminal and the first sub-switch, wherein when the first sub-switch is turned on, the first sub-current source provides the first sub-switching current to the control node.

4. The charge pump according to claim 1, wherein the second sub-switching current generator comprises:
    a second sub-switch electrically connected to the control node, wherein if the voltage level at the control node is higher than a reference voltage, the second sub-switch is turned on; and
    a second sub-current source electrically connected between the second voltage terminal and the second sub-switch, wherein when the second sub-switch is turned on, the second sub-current source provides the second sub-switching current to the control node.

5. The charge pump according to claim 1, wherein the current is selectively provided from the first sub-switching current generator or the second sub-switching current generator to the control node according to the phase comparing signal.

6. The charge pump according to claim 1, wherein if the voltage difference between the voltage level at the control node and the voltage level at the second voltage terminal is lower than a reference voltage, the first sub-switching current generator is enabled to provide the first sub-switching current to the control node.

7. The charge pump according to claim 1, wherein if the voltage difference between the voltage level at the control node and the voltage level at the second voltage terminal is higher than a reference voltage, the second sub-switching current generator is enabled to provide the second sub-switching current to the control node.

8. The charge pump according to claim 1, wherein the select circuit comprises:
    a comparator electrically connected to the control node for comparing the voltage level at the control node with a reference voltage, thereby outputting a voltage comparing signal; and
    a controlling unit electrically connected to comparator, the first sub-switching current generator and the second sub-switching current generator, wherein the controlling unit selects the first sub-switching current generator or the second sub-switching current generator to provide the current according to the voltage comparing signal.

9. The charge pump according to claim 8, wherein the select circuit further comprises an inverter, which is electrically connected between the comparator and the controlling unit for inverting the voltage comparing signal into an inverted voltage comparing signal, wherein the inverted voltage comparing signal is transmitted to the controlling unit.

10. The charge pump according to claim 8, wherein the controlling unit comprises:
    a first controlling block, electrically connected to the comparator and the first sub-switching current generator for outputting a first control signal according to the voltage comparing signal, wherein in response to the first control signal, a first sub-switch of the first sub-switching current generator is turned on, so that the first sub-switching current is provided by the first sub-switching current generator; and
    a second controlling block electrically connected to the comparator and the second sub-switching current generator for outputting a second control signal according to the voltage comparing signal, wherein in response to the second control signal, a second sub-switch of the second sub-switching current generator is turned on, so that the second sub-switching current is provided by the second sub-switching current generator.

* * * * *